US010497317B2

(12) United States Patent
Lim et al.

(10) Patent No.: US 10,497,317 B2
(45) Date of Patent: Dec. 3, 2019

(54) INTEGRATION DRIVER AND A DISPLAY DEVICE HAVING THE SAME

(71) Applicant: SAMSUNG DISPLAY CO., LTD., Yongin-Si, Gyeonggi-Do (KR)

(72) Inventors: Jae-Keun Lim, Suwon-Si (KR); Ji-Eun Park, Hwaseong-Si (KR); Young-Wook Yoo, Suwon-Si (KR); Hassan Kamal, Suwon-Si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 125 days.

(21) Appl. No.: 15/643,625

(22) Filed: Jul. 7, 2017

(65) Prior Publication Data

US 2018/0012550 A1 Jan. 11, 2018

(30) Foreign Application Priority Data

Jul. 7, 2016 (KR) ........................ 10-2016-0086294

(51) Int. Cl.
*G09G 3/3266* (2016.01)
*G09G 3/3225* (2016.01)

(52) U.S. Cl.
CPC ......... *G09G 3/3266* (2013.01); *G09G 3/3225* (2013.01); *G09G 2300/0426* (2013.01); *G09G 2310/08* (2013.01)

(58) Field of Classification Search
CPC ............... G09G 3/3266; G09G 3/3674; G09G 2310/0264; G09G 2310/0267
See application file for complete search history.

(56) References Cited

U.S. PATENT DOCUMENTS

| 9,368,069 | B2* | 6/2016 | Woo | G09G 3/3266 |
| 9,685,119 | B2* | 6/2017 | Kim | G09G 3/006 |
| 10,176,752 | B2* | 1/2019 | Chaji | G09G 3/3225 |
| 2007/0240024 | A1* | 10/2007 | Shin | G09G 3/325 |
| | | | | 714/726 |
| 2012/0062525 | A1* | 3/2012 | Kim | G09G 3/3233 |
| | | | | 345/204 |
| 2015/0015554 | A1* | 1/2015 | Kim | G09G 3/3208 |
| | | | | 345/208 |

(Continued)

FOREIGN PATENT DOCUMENTS

| KR | 1020130143318 | 12/2013 |
| KR | 1020140052289 | 5/2014 |

*Primary Examiner* — William Lu
(74) *Attorney, Agent, or Firm* — F. Chau & Associates, LLC

(57) ABSTRACT

An integration driver includes a plurality of stages. Each of the plurality of stages includes a scan signal generator including first to third nodes and a fifth node and an emission control signal generator including a fourth node and sixth node. The scan signal generator is configured to generate a first signal provided to a first node, a second signal provided to a second node, and a third signal provided to a third node using a first clock signal, a second clock signal, and a start signal or a carry signal, and generate a scan signal using the second signal and the third signal. The emission control signal generator is configured to generate a fourth signal provided to a fourth node using the third signal and the second clock signal, and generate an emission control signal using the first signal and the fourth signal.

21 Claims, 8 Drawing Sheets

(56) References Cited

U.S. PATENT DOCUMENTS

| | | | |
|---|---|---|---|
| 2015/0199932 A1* | 7/2015 | Ohara | G09G 3/3233 345/212 |
| 2015/0270011 A1* | 9/2015 | Umezaki | G11C 19/28 377/64 |
| 2016/0042691 A1* | 2/2016 | Na | G09G 3/3266 345/205 |
| 2016/0133185 A1* | 5/2016 | Yoon | G09G 3/3233 345/76 |
| 2016/0275845 A1* | 9/2016 | Tsai | G09G 3/3266 |
| 2016/0351160 A1* | 12/2016 | In | G09G 3/3225 |
| 2017/0263188 A1* | 9/2017 | Na | G09G 3/3258 |

* cited by examiner

INTEGRATION DRIVER AND A DISPLAY DEVICE HAVING THE SAME

CROSS-REFERENCE TO RELATED APPLICATION

This application claims priority under 35 U.S.C. § 119 to Korean Patent Application No. 10-2016-0086294, filed on Jul. 7, 2016 in the Korean Intellectual Property Office (KIPO), the disclosure of which is incorporated by reference herein in its entirety.

TECHNICAL FIELD

Exemplary embodiments of the present inventive concept relate to an organic light emitting display device and an electronic device having the same. More particularly, exemplary embodiments of the present inventive concept relate to an integration driver and a display device having the same.

DISCUSSION OF RELATED ART

Flat panel display (FPD) devices are widely used as display devices of electronic devices because FPD devices are relatively lightweight and thin compared to cathode-ray tube (CRT) display devices. Examples of FPD devices include liquid crystal display (LCD) devices, field emission display (FED) devices, plasma display panel (PDP) devices, and organic light emitting display (OLED) devices. OLED devices, for example, have various features such as a wide viewing angle, a rapid response speed, a thin profile, low power consumption, etc.

An OLED device may include a display panel, a data driver that provides a data signal, a scan driver that provides a scan signal, an emission control driver that provides an emission control signal, and a timing controller that controls the data driver, the scan driver, and the emission control driver. Here, dead space in the display panel may increase because scan stages of the scan driver and emission stages of the emission control driver are separately disposed in the display panel.

SUMMARY

According to an exemplary embodiment of the present inventive concept, an integration driver may include a plurality of stages. Each of the plurality of stages may include a scan signal generator including first to third nodes and a fifth node and an emission control signal generator including a fourth node and a sixth node. The scan signal generator is configured to generate a first signal provided to a first node, a second signal provided to a second node, and a third signal provided to a third node using a first clock signal, a second clock signal, and a start signal or a carry signal, and generate a scan signal using the second signal and the third signal. The emission control signal generator is configured to generate a fourth signal provided to a fourth node using the third signal and the second clock signal, and generate an emission control signal using the first signal and the fourth signal.

In exemplary embodiments of the present inventive concept, the scan signal generator may include a first switching transistor, a second switching transistor, a third switching transistor, a fourth switching transistor, a fifth switching transistor, a sixth switching transistor, a seventh switching transistor, an eighth switching transistor, a first capacitor, and a second capacitor. The first switching transistor is configured to turn on or off in response to the first clock signal and is coupled between a first node and one of a start signal providing line or a carry signal providing line. The second switching transistor is configured to turn on or off in response to the third signal and is coupled between a first voltage providing line and the fifth node. The third switching transistor is configured to turn on or off in response to the second clock signal and is coupled between the first node and the fifth node. The fourth switching transistor is configured to turn on or off in response to the first signal and is coupled between a first clock signal providing line and the third node. The fifth switching transistor is configured to turn on or off in response to the first clock signal and is coupled between a second voltage providing line and the third node. The sixth switching transistor is configured to turn on or off in response to the third signal and is coupled between the first voltage providing line and a scan output node. The seventh switching transistor is configured to turn on or off in response to the second signal and is coupled between the scan output node and a second clock signal providing line. The eighth switching transistor is configured to turn on or off in response to a second voltage provided by the second voltage providing line and is coupled between the first node and the second node. The first capacitor is coupled between the first voltage providing line and the third node. The second capacitor is coupled between the second node and the scan output node.

In exemplary embodiments of the present inventive concept, a first voltage provided by the first voltage providing line may be output as the scan signal when the sixth switching transistor turns on, and the second clock signal may be output as the scan signal when the seventh switching transistor turns on.

In exemplary embodiments of the present inventive concept, the emission control signal generator may include a first switching transistor, a second switching transistor, a third switching transistor, a fourth switching transistor, and a capacitor. The first switching transistor is configured to turn on or off in response to a second voltage provided by a second voltage providing line and is coupled between the third node and the fourth node. The second switching transistor is configured to turn on or off in response to the fourth signal and is coupled between a second clock signal providing line and a sixth node. The third switching transistor is configured to turn on or off in response to the first signal and is coupled between a first voltage providing line and an emission output node. The fourth switching transistor is configured to turn on or off in response to the fourth signal and is coupled between the second voltage providing line and the emission output node. The capacitor is coupled between the fourth node and the sixth node.

In exemplary embodiments of the present inventive concept, a first voltage provided by the first voltage providing line may be output as the emission control signal when the third switching transistor turns on, and the second voltage may be output as the emission control signal when the fourth switching transistor turns on.

In exemplary embodiments of the present inventive concept, a W/L ratio of the third switching transistor may be greater than a W/L ratio of the fourth switching transistor.

In exemplary embodiments of the present inventive concept, a W/L ratio of the fourth switching transistor may be less than 1.

In exemplary embodiments of the present inventive concept, the integration driver may further include an initialization signal generator configured to generate a fifth signal provided to a seventh node using the first signal, and generate an initialization signal using the fifth signal and a third clock signal.

In exemplary embodiments of the present inventive concept, the initialization signal generator may include a first switching transistor, a second switching transistor, and a capacitor. The first switching transistor is configured to turn on or off in response to a voltage and is coupled between the first node and the seventh node. The second switching transistor is configured to turn on or off in response to the fifth signal and is coupled between a third clock signal providing line and an initialization signal output node. The capacitor is coupled between the seventh node and the initialization signal output node.

In exemplary embodiments of the present inventive concept, the carry signal may be the scan signal provided from a previous stage.

According to an exemplary embodiment of the present inventive concept, a display device may include a display panel including a plurality of pixels, an integration driver including a plurality of stages each configured to provide a scan signal and an emission control signal to the plurality of pixels, a data driver configured to provide a data signal to the plurality of pixels through a data line, and a timing controller configured to generate control signals that control the integration driver and the data driver. Each of the plurality of stages may include a scan signal generator including first to third nodes and a fifth node and an emission control signal generator including a fourth node and a sixth node. The scan signal generator is configured to generate a first signal provided to a first node, a second signal provided to a second node and a third signal provided to a third node using a first clock signal, a second clock signal, and a start signal or a carry signal, and generate the scan signal using the second signal and the third signal. The emission control signal generator is configured to generate a fourth signal provided to a fourth node using the third signal and the second clock signal, and generate the emission control signal using the first signal and the fourth signal.

In exemplary embodiments of the present inventive concept, the scan signal generator may include a first switching transistor, a second switching transistor, a third switching transistor, a fourth switching transistor, a fifth switching transistor, a sixth switching transistor, a seventh switching transistor, an eighth switching transistor, a first capacitor, and a second capacitor. The first switching transistor is configured to turn on or off in response to the first clock signal and is coupled between a first node and one of a start signal providing line or a carry signal providing line. The second switching transistor is configured to turn on or off in response to the third signal and is coupled between a first voltage providing line and the fifth node. The third switching transistor is configured to turn on or off in response to the second clock signal and is coupled between the first node and the fifth node. The fourth switching transistor is configured to turn on or off in response to the first signal and is coupled between a first clock signal providing line and the third node. The fifth switching transistor is configured to turn on or off in response to the first clock signal and is coupled between a second voltage providing line and the third node. The sixth switching transistor is configured to turn on or off in response to the third signal and is coupled between the first voltage providing line and a scan output node. The seventh switching transistor is configured to turn on or off in response to the second signal and is coupled between the scan output node and a second clock signal providing line. The eighth switching transistor is configured to turn on or off in response to a second voltage provided by the second voltage providing line and is coupled between the first node and the second node. The first capacitor is coupled between the first voltage providing line and the third node. The second capacitor is coupled between the second node and the scan output node.

In exemplary embodiments of the present inventive concept, a first voltage provided by the first voltage providing line may be output as the scan signal when the sixth switching transistor turns on, and the second clock signal may be output as the scan signal when the seventh switching transistor turns on.

In exemplary embodiments of the present inventive concept, the emission control signal generator may include a first switching transistor, a second switching transistor, a third switching transistor, a fourth switching transistor, and a capacitor. The first switching transistor is configured to turn on or off in response to a second voltage provided by a second voltage providing line and is coupled between the third node and the fourth node. The second switching transistor is configured to turn on or off in response to the fourth signal and is coupled between a second clock signal providing line and a sixth node. The third switching transistor is configured to turn on or off in response to the first signal and is coupled between a first voltage providing line and an emission output node. The fourth switching transistor is configured to turn on or off in response to the fourth signal and is coupled between the second voltage providing line and the emission output node. The capacitor is coupled between the fourth node and the sixth node.

In exemplary embodiments of the present inventive concept, a first voltage provided by the first voltage providing line may be output as the emission control signal when the third switching transistor turns on, and the second voltage may be output as the emission control signal when the fourth switching transistor turns on.

In exemplary embodiments of the present inventive concept, a W/L ratio of the third switching transistor may be greater than a W/L ratio of the fourth switching transistor.

In exemplary embodiments of the present inventive concept, a W/L ratio of the fourth switching transistor may be less than 1.

In exemplary embodiments of the present inventive concept, the integration driver may further include an initialization signal generator configured to generate a fifth signal provided to a seventh node using the first signal, and generate an initialization signal using the fifth signal and a third clock signal.

In exemplary embodiments of the present inventive concept, the initialization signal generator may include a first switching transistor, a second switching transistor, and a capacitor. The first switching transistor is configured to turn on or off in response to a voltage and is coupled between the first node and the seventh node. The second switching transistor is configured to turn on or off in response to the fifth signal and is coupled between a third clock signal providing line and an initialization signal output node. The capacitor is coupled between the seventh node and the initialization signal output node.

In exemplary embodiments of the present inventive concept, the carry signal may be the scan signal provided from a previous stage.

According to an exemplary embodiment of the present inventive concept, an integration driver includes a plurality of stages. Each of the plurality of stages includes a scan signal generator configured to generate a scan signal and an emission control signal generator configured to generate an emission control signal. The scan signal generator includes a first node to which a first signal is provided, a second node to which a second signal is provided, a third node to which a third signal is provided, a fourth node to which a fourth signal is provided, a fifth node to which a fifth signal is provided, a first switching transistor, a second switching transistor, a third switching transistor, a fourth switching transistor, a fifth switching transistor, a sixth switching transistor, a seventh switching transistor, and an eighth switching transistor. The first switching transistor has a gate electrode connected to a first clock signal providing line, a first electrode connected to a start signal providing line or a carry signal providing line, and a second electrode connected to the first node. The second switching transistor has a gate electrode connected to the third node, a first electrode connected to a first voltage providing line, and a second electrode connected to the fifth node. The third switching transistor has a gate electrode connected to a second clock signal providing line, a first electrode connected to the first node, and a second electrode connected to the fifth node. The fourth switching transistor has a gate electrode connected to the first node, a first electrode connected to the third node, and a second electrode connected to the first clock signal providing line. The fifth switching transistor has a gate electrode connected to the first clock signal providing line, a first electrode connected to the third node, and a second electrode connected to a second voltage providing line. The sixth switching transistor has a gate electrode connected to the third node, a first electrode connected to the first voltage providing line, and a second electrode connected to a scan output node configured to output the scan signal. The seventh switching transistor has a gate electrode connected to the second node, a first electrode connected to the scan output node, and a second electrode connected to the second clock signal providing line. The eighth switching transistor has a gate electrode connected to the second voltage providing line, a first electrode connected the first node, and a second electrode connected to the second node. The emission control signal generator is connected to the first node and the third node of the scan signal generator and is configured to generate the emission control signal using the first signal and the third signal.

BRIEF DESCRIPTION OF THE DRAWINGS

The above and other features of the present inventive concept will be more clearly understood by describing in detail exemplary embodiments thereof with reference to the accompanying drawings.

DETAILED DESCRIPTION OF THE EMBODIMENTS

Figure 1:
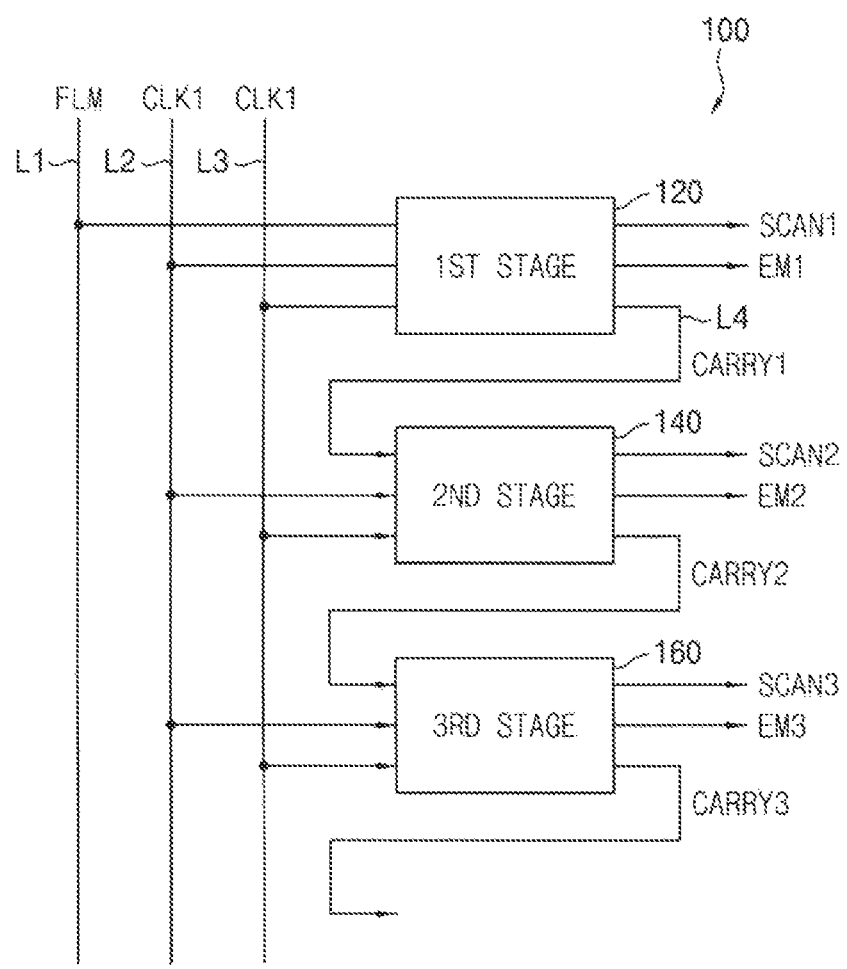
FIG. 1 is a block diagram illustrating an integration driver according to an exemplary embodiment of the present inventive concept.

Exemplary embodiments of the present inventive concept will be described more fully hereinafter with reference to the accompanying drawings. Like reference numerals may refer to like elements throughout this application.

Exemplary embodiments of the present inventive concept provide an integration driver capable of generating a scan signal and an emission control signal.

Exemplary embodiments of the present inventive concept also provide a display device that includes the integration driver capable of generating the scan signal and the emission control signal.

FIG. 1 is a block diagram illustrating an integration driver according to an exemplary embodiment of the present inventive concept.

Referring to FIG. 1, an integration driver 100 may include first to third stages 120, 140, and 160. The first to third stages 120, 140, and 160 may be dependently coupled. Each of the first to third stages 120, 140, and 160 may output scan signals SCAN1, SCAN2, and SCAN 3 and emission control signals EM1, EM2, and EM3. The scan signals SCAN1, SCAN2, and SCAN 3 and the emission control signals EM1, EM2, and EM3 may be provided to pixels of a display panel.

The first to third stages 120, 140, and 160 may be coupled to a first clock signal providing line L2 and a second clock signal providing line L3. Each of the first to third stages 120, 140, and 160 may receive a first clock signal CLK1 through the first clock signal providing line L2 and a second clock signal CLK2 through the second clock signal providing line L3. The first stage 120 may be coupled to a start signal providing line L1. The first stage 120 may receive a start signal FLM through the start signal providing line L1. The second and third stages 140 and 160 may receive carry signals CARRY1 and CARRY2 provided from a previous stage through a carry signal providing line L4. Additionally, the third stage 160 may provide a carry signal CARRY3 to a subsequent stage. Here, the carry signals CARRY1, CARRY2, and CARRY3 may be substantially the same as the scan signal output from the previous stage. The stages 120, 140, and 160 may be coupled to a first voltage providing line and a second voltage providing line. Each of the first to third stages 120, 140, and 160 may receive a first voltage from the first voltage providing line and a second voltage from the second voltage providing line. Here, the first voltage may be a voltage having a high level (e.g., 10V) and the second voltage may be a voltage having a low level (e.g., −10V).

The first stage 120 may generate a first scan signal SCAN1 and a first emission control signal EM1 based on the first clock signal CLK1, the second clock signal CLK1, and the start signal FLM provided from a timing controller. The first scan signal SCAN1 may be provided to the pixels through a first scan line. Here, the first scan signal SCAN1 may be provided to the second stage 140 as the first carry signal CARRY1. Furthermore, the first emission control signal EM1 may be provided to the pixels through a first emission control line.

The second stage 140 may generate a second scan signal SCAN2 and a second emission control signal EM2 based on the first carry signal CARRY1 provided from the first stage 120 and the first clock signal CLK1 and the second clock signal CLK2 provided from the timing controller. The second scan signal SCAN2 may be provided to the pixels through a second scan line. Here, the second scan signal SCAN2 may be provided to the third stage 160 as the second carry signal CARRY2. Furthermore, the second emission control signal EM2 may be provided to the pixels through a second emission control line.

The third stage 160 may generate a third scan signal SCAN3 and a third emission control signal EM3 based on the second carry signal CARRY2 provided from the second stage 140 and the first clock signal CLK1 and the second clock signal CLK2 provided from the timing controller. The third scan signal SCAN3 may be provided to the pixels through a third scan line. Here, the third scan signal SCAN3 may be provided to a fourth or subsequent stage as the third carry signal CARRY3. Furthermore, the third emission control signal EM3 may be provided to the pixels through a third emission control line.

As described above, the first to third stages 120, 140, and 160 of the integration driver 100 may be dependently coupled and may provide the scan signals SCAN1, SCAN2, and SCAN3 and the emission control signals EM1, EM2, and EM3. The first stage 120 may generate the first scan signal SCAN1 and the first emission control signal EM1 based on the first clock signal CLK1, the second clock signal CLK2, and the start signal FLM. An Nth stage may generate an Nth scan signal SCAN[N] and an Nth emission control signal EM[N] based on the first clock signal CLK1, the second clock signal CLK2, and an (N−1)th carry signal CARRY[N−1] provided from an (N−1)th stage.

Figure 2:
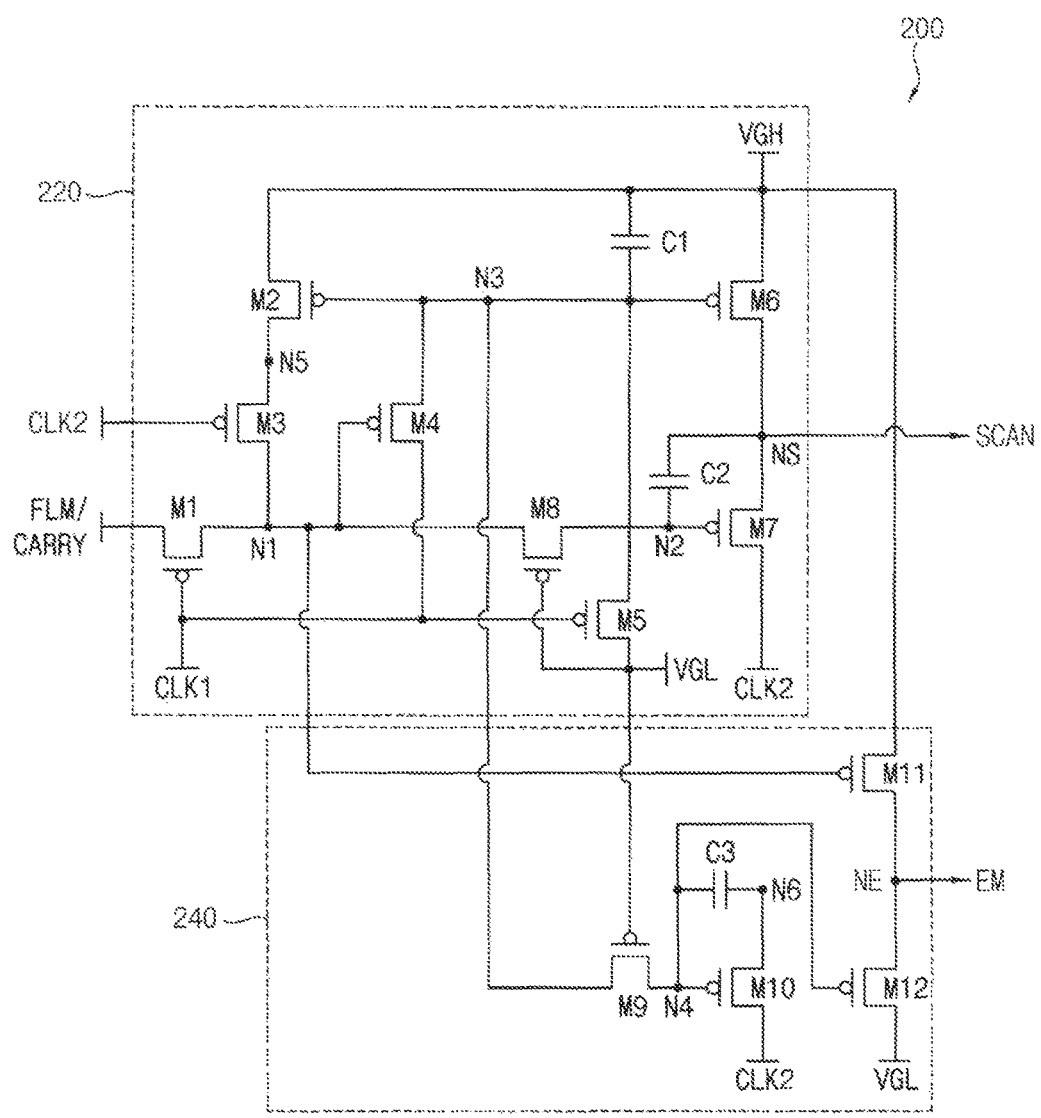
FIG. 2 is a circuit diagram illustrating a stage included in the integration driver of FIG. 1 according to an exemplary embodiment of the present inventive concept.

FIG. 2 is a circuit diagram illustrating a stage included in the integration driver of FIG. 1 according to an exemplary embodiment of the present inventive concept.

Referring to FIG. 2, a stage 200 of the integration driver 100 may include a scan signal generator 220 and an emission control signal generator 240. The stage 200 may include, for example, first to sixth nodes N1 to N6.

The scan signal generator 220 may generate a first signal provided to the first node N1, a second signal provided to the second node N2, and a third signal provided to the third node N3 based on the first clock signal CLK1, the second clock signal CLK2, and the start signal FLM or a carry signal CARRY (e.g., one of the carry signals CARRY1 to CARRY3). The scan signal generator 220 may generate a scan signal SCAN based on the second signal and the third signal. Here, the first signal is a voltage provided to the first node N1, the second signal is a voltage provided to the second node N2, and the third signal is a voltage provided to the third node N3. The first signal, the second signal, and the third signal may have a high level voltage or a low level voltage to control an operation of switching transistors. When the stage 200 of FIG. 2 is the first stage 120, the scan signal generator 220 may receive the start signal FLM, the first clock signal CLK1, and the second clock signal CLK2. When the stage 200 of FIG. 2 is the Nth stage, the scan signal generator 220 may receive the carry signal CARRY, the first clock signal CLK1, and the second clock signal CLK2. Here, the carry signal may be substantially the same as the scan signal SCAN provided from the (N−1)th stage.

The scan signal generator 220 may include a first switching transistor M1, a second switching transistor M2, a third switching transistor M3, a fourth switching transistor M4, a fifth switching transistor M5, a sixth switching transistor M6, a seventh switching transistor M7, a first capacitor C1, and a second capacitor C2.

The first switching transistor M1 may turn on or off in response to the first clock signal CLK1. The first switching transistor M1 may be coupled between the first node N1 and the start signal providing line L1 or the carry signal providing line L4. The first switching transistor M1 may have a gate electrode coupled to the first clock signal providing line L2, a first electrode coupled to the start signal providing line L1 or the carry signal providing line L4, and a second electrode coupled to the first node N1. The start signal FLM provided through the start signal providing line L1 or the carry signal CARRY provided through the carry signal providing line L4 may be provided to the first node N1 when the first switching transistor M1 turns on.

The second switching transistor M2 may turn on or off in response to the third signal. The second switching transistor M2 may be coupled between the first voltage providing line and the fifth node N5. The second switching transistor M2 may have a gate electrode coupled to the third node N3, a first electrode coupled to the first voltage providing line, and a second electrode coupled to the fifth node N5. A first voltage VGH, provided through the first voltage providing line, may be provided to the fifth node N5.

The third switching transistor M3 may turn on or off in response to the second clock signal CLK2. The third switching transistor M3 may be coupled between the first node N1 and the fifth node N5. The third switching transistor M3 may include a gate electrode coupled to the second clock signal providing line L3, a first electrode coupled to the first node N1, and a second electrode coupled to the fifth node N5. A voltage of the fifth node N5 may be provided to the first node N1 when the third switching transistor M3 turns on.

The fourth switching transistor M4 may turn on or off in response to the first signal. The fourth switching transistor M4 may be coupled between the first clock signal providing line L2 and the third node N3. The fourth switching transistor M4 may have a gate electrode coupled to the first node N1, a first electrode coupled to the third node N3, and a second electrode coupled to the first clock signal providing line L2. The first clock signal CLK1 may be provided to the third node N3 when the fourth switching transistor M4 turns on.

The fifth switching transistor M5 may turn on or off in response to the first clock signal CLK1. The fifth switching transistor M5 may be coupled between the second voltage providing line and the third node N3. The fifth switching transistor M5 may have a gate electrode coupled to the first clock signal providing line L2, a first electrode coupled to the third node N3, and a second electrode coupled to the second voltage providing line. A second voltage VGL provided through the second voltage providing line may be provided to the third node N3 when the fifth switching transistor M5 turns on.

The sixth switching transistor M6 may turn on or off in response to the third signal. The sixth switching transistor M6 may be coupled between the first voltage providing line and a scan output node NS. The sixth switching transistor M6 may have a gate electrode coupled to the third node N3, a first electrode coupled to the first voltage providing line, and a second electrode coupled to the scan output node NS. The first voltage VGH provided through the first voltage providing line may be provided to the scan output node NS when the sixth switching transistor M6 turns on. Here, the first voltage VGH provided to the scan output node NS may be output as the scan signal SCAN.

The seventh switching transistor M7 may turn on or off in response to the second signal. The seventh switching transistor M7 may be coupled between the second clock signal providing line L3 and the scan output node NS. The seventh switching transistor M7 may have a gate electrode coupled to the second node N2, a first electrode coupled to the scan output node NS, and a second electrode coupled to the second clock signal providing line L3. The second clock signal CLK2 may be provided to the scan output node NS when the seventh switching transistor M7 turns on. Here, the second clock signal CLK2 provided to the scan output node NS may be output as the scan signal SCAN.

The eighth switching transistor M8 may turn on or off in response to the second voltage VGL. The eighth switching transistor M8 may be coupled between the first node N1 and the second node N2. The eighth switching transistor M8 may have a gate electrode coupled to the second voltage providing line, a first electrode coupled to the first node N1, and a second electrode coupled to the second node N2. The voltage provided to the first node N1 (e.g., the first signal) may be provided to the second node N2 when the eighth switching transistor M8 turns on.

The first capacitor C1 may be coupled between the first voltage providing line and the third node N3. The first capacitor C1 may have a first electrode coupled to the first voltage providing line and a second electrode coupled to the third node N3. The first capacitor C1 may store a voltage difference between the first voltage VGH and the voltage provided to the third node N3 (e.g., the third signal).

The second capacitor C2 may be coupled between the second node N2 and the scan output node NS. The second capacitor C2 may have a first electrode coupled to the second node N2 and a second electrode coupled to the scan output node NS. The second capacitor may store a voltage difference between the voltage provided to the second node N2 (e.g., the second signal) and the voltage provided to the scan output node NS.

The emission control signal generator 240 may generate a fourth signal provided to the fourth node N4 based on the third signal and the second clock CLK2 and generate an emission control signal EM based on the first signal and the fourth signal. Here, the fourth signal may be the voltage provided to the fourth node N4. The fourth signal may have a high level voltage or a low level voltage to control an operation of a switching transistor.

The emission control signal generator 240 may include a ninth switching transistor M9, a tenth switching transistor M10, an eleventh switching transistor M11, a twelfth switching transistor M12, and a third capacitor C3.

The ninth switching transistor M9 may turn on or off in response to the second voltage VGL. The ninth switching transistor M9 may be coupled between the third node N3 and the fourth node N4. The ninth switching transistor M9 may have a gate electrode coupled to the second voltage providing line, a first electrode coupled to the third node N3, and a second electrode coupled to the fourth node N4. The voltage provided to the third node N3 (e.g., the third signal) may be provided to the fourth node N4 when the ninth switching transistor M9 turns on.

The tenth switching transistor M10 may turn on or off in response to the fourth signal. The tenth switching transistor M10 may be coupled between the second clock signal providing line L3 and a sixth node N6. The tenth switching transistor M10 may include a gate electrode coupled to the fourth node N4, a first electrode coupled to the second clock signal providing line L3, and a second electrode coupled to the sixth node N6. The second clock signal CLK2 may be provided to the sixth node N6 when the tenth switching transistor M10 turns on.

The eleventh switching transistor M11 may turn on or off in response to the first signal. The eleventh switching transistor M11 may be coupled between the first voltage providing line and an emission output node NE. The eleventh switching transistor M11 may include a gate electrode coupled to the first node N1, a first electrode coupled to the first voltage providing line, and a second electrode coupled to the emission output node NE. The first voltage VGH may be provided to the emission output node NE when the eleventh switching transistor M11 turns on. Here, the first voltage VGH provided to the emission output node NE may be output as the emission control signal EM.

The twelfth switching transistor M12 may turn on or off in response to the fourth signal. The twelfth switching transistor M12 may be coupled between the second voltage providing line and the emission output node NE. The twelfth switching transistor M12 may include a gate electrode coupled to the fourth node N4, a first electrode coupled to the emission output node NE, and a second electrode coupled to the second voltage providing line. The second voltage VGL may be provided to the emission output node NE when the twelfth switching transistor M12 turns on. Here, the second voltage VGL provided to the emission output node NE may be output as the emission control signal EM.

The W/L ratio of the eleventh switching transistor M11 may be greater than the W/L ratio of the twelfth switching transistor M12, where the W is a width of the channel and the L is a length of the channel. For example, the W/L ratio of the twelfth switching transistor M12 may be less than 1.

The third capacitor C3 may be coupled between the fourth node N4 and the sixth node N6. The third capacitor C3 may have a first electrode coupled to the fourth node N4, and a second electrode coupled to the sixth node N6. The third capacitor C3 may store a voltage difference between the voltage provided to the fourth node N4 (e.g., the fourth signal) and the voltage provided to the sixth node N6.

The first through twelfth switching transistors M1, ..., M12 may be implemented as PMOS (P-Channel Metal-Oxide Semiconductor) transistors, as illustrated in FIG. 2. In this case, the first through twelfth switching transistors M1, ..., M12 may turn on in response to a signal having a low level voltage (e.g., VGL). Although the first through twelfth switching transistors M1, ..., M12 are implemented as PMOS transistors in FIG. 2, the present inventive concept is not limited thereto. For example, the first through twelfth switching transistors M1, ..., M12 may be implemented as NMOS (N-Channel Metal-Oxide Semiconductor) transistors. In this case, the first through twelfth switching transistors M1, ..., M12 may turn on in response to a signal having a high level voltage (e.g., VGH).

Figure 3:
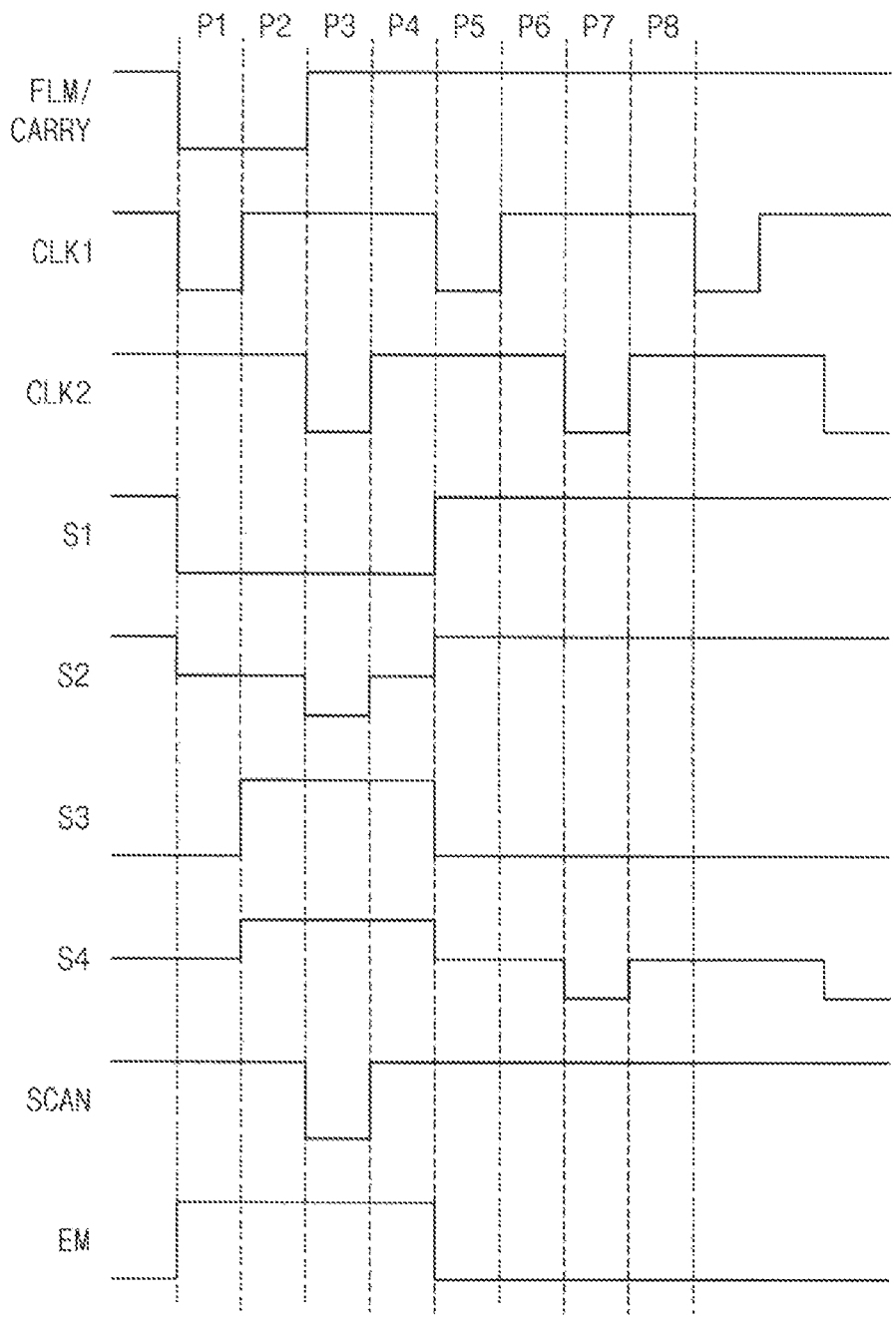
FIG. 3 is a timing diagram illustrating an operation of the stage of FIG. 2 according to an exemplary embodiment of the present inventive concept.

FIG. 3 is a timing diagram illustrating an operation of the stage of FIG. 2 according to an exemplary embodiment of the present inventive concept.

Referring to FIG. 3, the first clock signal CLK1 and the second clock signal CLK2 may have substantially the same cycle. The second clock signal CLK2 may be shifted with respect the first clock signal CLK1 by a predetermined period. The first through twelfth switching transistors M1, ..., M12 of the stage 200 of FIG. 2 may turn on in response to a voltage having the low level and turn off in response to a voltage having the high level. Voltages provided at the first to fourth nodes N1 to N4 may be referred to as a first signal S1, a second signal S2, a third signal S3, and a fourth signal S4, respectively.

During a first period P1, the first clock signal CLK1 having the low level, the second clock signal CLK2 having the high level, and the start signal FLM or the carry signal CARRY having the low level may be provided to the stage 200.

The scan signal generator 220 may output the scan signal SCAN having the high level in the first period P1. The first switching transistor M1 and the fifth switching transistor M5 may turn on in response to the first clock signal CLK1 having the low level. The start signal FLM or the carry signal CARRY having the low level may be provided to the first node N1 when the first switching transistor M1 turns on. Here, the first signal S1 having the low level may be provided to the first node N1. The fourth switching transistor M4 may turn on in response to the voltage of the first node N1 (e.g., the first signal S1) having the low level. The first clock signal CLK1 having the low level may be provided to the third node N3 when the fourth switching transistor M4 turns on. Here, the third signal S3 having the low level may be provided to the third node N3. The sixth switching transistor M6 may turn on in response to the third signal S3. The first voltage VGH having the high level may be provided to the scan output node NS when the sixth switching transistor M6 turns on. The first voltage VGH provided to the scan output node NS may be output as the scan signal SCAN.

During a second period P2, the first clock signal CLK1 having the high level, the second clock signal CLK2 having the high level, and the start signal FLM or the carry signal CARRY having the low level may be provided to the stage 200.

The scan signal generator 220 may output the scan signal SCAN having the high level in the second period P2. The voltage of the second node N2 (e.g., the second signal S2) having the low level may be maintained by the second capacitor C2 during the second period P2. The seventh switching transistor M7 may turn on in response to the second signal S2 having the low level. The second clock signal CLK2 have the high level may be provided to the scan output node NS when the seventh switching transistor M7 turns on. The second clock signal CLK2 having the high level provided to the scan output node NS may be output as the scan signal SCAN. The first switching transistor M1 may turn off in response to the first clock signal CLK1 having the high level. The eighth switching transistor M8 may turn on in response to the second voltage VGL. The voltage of the second node N2 (e.g., the second signal S2) may be provided to the first node N1 when the eighth switching transistor M8 turns on. The fourth switching transistor M4 may turn on in response to the first signal S1 having the low level. The first clock signal CLK1 having the high level may be provided to the third node N3 when the fourth switching transistor M4 turns on. In other words, the third signal S3 may have the high level. The sixth switching transistor M6 may turn off in response to the third signal S3 having the high level.

The emission control signal generator 240 may output the emission control signal EM having the high level during the second period P2. The eleventh switching transistor M11 may turn on in response to the voltage of the first node N1 (e.g., the first signal S1) having the low level. The first voltage VGH may be provided to the emission output node NE when the eleventh switching transistor M11 turns on. The first voltage VGH having the high level provided to the emission output node NE may be output as the emission control signal EM. The ninth switching transistor M9 may turn on in response to the second voltage VGL. The voltage of the third node N3 (e.g., the third signal S3) having the high level may be provided to the fourth node N4 when the ninth switching transistor M9 turns on. The twelfth switching transistor M12 may turn off in response to the voltage of the fourth node N4 (e.g., the fourth signal S4) having the high level.

During a third period P3, the first clock signal CLK1 having the high level, the second clock signal CLK2 having the low level, and the start signal FLM or the carry signal CARRY having the high level may be provided to the stage 200.

The scan signal generator 220 may output the scan signal SCAN having the low level during the third period P3. The voltage of the second node N2 (e.g., the second signal S2) having the low level may be maintained by the second capacitor C2 during the third period P3. The seventh switching transistor M7 may turn on in response to the second signal S2 having the low level. The second clock signal CLK2 having the low level may be provided to the scan output node NS when the seventh switching transistor M7 turns on. The second clock signal CLK2 having the low level provided to the scan output node NS may be output as the scan signal SCAN. Here, the voltage of the second node N2 (e.g., the second signal S2) may have a decreased voltage level due to the second capacitor C2. In other words, the voltage of the second node N2 may fall because a voltage difference between the second node N2 and the scan output node NS is maintained by the second capacitor C2 when the second clock signal CLK2 having the low level is provided to the scan output node NS. The first switching transistor M1 may turn off in response to the first clock signal CLK1 having the high level. The eighth switching transistor M8 may turn on in response to the second voltage VGL. The voltage of the second node N2 (e.g., the second signal S2) may be provided to the first node N1 when the eighth switching transistor M8 turns on. The fourth switching transistor M4 may turn on in response to the first signal S1 having the low level. The first clock signal CLK1 having the high level may be provided to the third node N3 when the fourth switching transistor M4 turns on. In other words, the third signal S3 may have the high level. The sixth switching transistor M6 may turn off in response to the third signal S3 having the high level.

The emission control signal generator 240 may output the emission control signal EM having the high level during the third period P3. The eleventh switching transistor M11 may turn on in response to the voltage of the first node N1 (e.g., the first signal S1) having the low level. The first voltage VGH may be provided to the emission output node NE when the eleventh switching transistor M11 turns on. The first voltage VGH having the high level provided to the emission output node NE may be output as the emission control signal EM. The ninth switching transistor M9 may turn on in response to the second voltage VGL. The voltage of the third node N3 (e.g., the third signal S3) may be provided to the fourth node N4 when the ninth switching transistor M9 turns on. The twelfth switching transistor M12 may turn off in response to the voltage of the fourth node N4 (e.g., the fourth signal S4) having the high level.

During a fourth period P4, the first clock signal CLK1 having the high level, the second clock signal CLK2 having the high level, and the start signal FLM or the carry signal CARRY having the high level may be provided to the stage 200.

The scan signal generator 220 may output the scan signal SCAN having the high level during the fourth period P4. The seventh switching transistor M7 may turn on in response to the second signal S2 having the low level. The second clock signal CLK2 having the low level may be provided to the scan output node NS when the seventh switching transistor M7 turns on. The second clock signal CLK2 having the high level provided to the scan output node NS may be output as the scan signal SCAN. Here, the voltage of the second node N2 (e.g., the second signal S2) may have an increased voltage level due to the second capacitor C2. In other words, the voltage of the second node N2 may increase because a voltage difference between the second node N2 and the scan output node NS is maintained by the second capacitor C2 when the second clock signal CLK2 having the high level is provided to the scan output node NS. The first switching transistor M1 may turn off in response to the first clock signal CLK1 having the high level. The eighth switching transistor M8 may turn on in response to the second voltage VGL. The voltage of the second node N2 (e.g., the second signal S2) may be provided to the first node N1 when the eighth switching transistor M8 turns on. The fourth switching transistor M4 may turn on in response to the first signal S1 having the low level. The first clock signal CLK1 having the high level may be provided to the third node N3 when the fourth switching transistor M4 turns on. In other words, the third signal S3 may have the high level. The sixth switching transistor M6 may turn off in response to the third signal S3 having the high level.

The emission control signal generator 240 may output the emission control signal EM having the high level during the fourth period P4. The eleventh switching transistor M11 may turn on in response to the voltage of the first node N1 (e.g., the first signal S1) having the low level. The first voltage VGH may be provided to the emission output node NE when the eleventh switching transistor M11 turns on. The first voltage VGH having the high level provided to the emission output node NE may be output as the emission control signal EM. The ninth switching transistor M9 may turn on in response to the second voltage VGL. The voltage of the third node N3 (e.g., the third signal S3) may be provided to the fourth node N4 when the ninth switching transistor M9 turns on. The twelfth switching transistor M12 may turn off in response to the voltage of the fourth node N4 (e.g., the fourth signal S4) having the high level.

During a fifth period P5, the first clock signal CLK1 having the low level, the second clock signal CLK2 having the high level, and the start signal FLM or the carry signal CARRY having the high level may be provided to the stage 200.

The scan signal generator 220 may output the scan signal SCAN having the high level during the fifth period P5. The first switching transistor M1 and the fifth switching transistor M5 may turn on in response to the first clock signal CLK1 having the low level. The start signal FLM or the carry signal CARRY having the high level may be provided to the first node N1 when the first switching transistor M1 turns on. Here, the first signal S1 having the high level may be provided to the first node N1. The fourth switching transistor M4 may turn off in response to the voltage of the first node N1 (e.g., the first signal S1) having the high level. The second voltage VGL having the low level may be provided to the third node when the fifth switching transistor M5 turns on. The sixth switching transistor M6 may turn on in response to the voltage of the third node N3 (e.g., the third signal S3) having the low level. The first voltage VGH having the high level may be provided to the scan output node NS. The first voltage VGH provided to the scan output node NS may be output as the scan signal SCAN.

The emission control signal generator 240 may output the emission control signal EM having the low level during the fifth period P5. The eleventh switching transistor M11 may turn off in response to the voltage of the first node N1 (e.g., the first signal S1) having the high level. The ninth switching transistor M9 may turn on in response to the second voltage VGL. The voltage of the third node N3 (e.g., the third signal S3) having the low level may be provided to the fourth node N4 when the ninth switching transistor M9 turns on. The twelfth switching transistor M12 may turn on in response to the voltage of the fourth node N4 (e.g., the fourth signal S4) having the low level. The second voltage VGL having the low level may be provided to the emission output node NE when the twelfth switching transistor M12 turns on. The second voltage VGL provided to the emission output node NE may be output as the emission control signal EM.

During a sixth period P6, the first clock signal CLK1 having the high level, the second clock signal CLK2 having the high level, and the start signal FLM or the carry signal CARRY having the high level may be provided to the stage 200.

The scan signal generator 220 may output the scan signal SCAN having the high level in the sixth period P6. The voltage of the second node N2 (e.g., the second signal S2) having the high level may be maintained by the second capacitor C2 during the sixth period P6. The seventh switching transistor M7 may turn off in response to the second signal S2 having the high level. The eighth switching transistor M8 may turn on in response to the second voltage VGL having the low level. The voltage of the second node N2 having the high level may be provided to the first node N1 when the eighth switching transistor M8 turns on. The fourth switching transistor M4 may turn off in response to the voltage of the first node N2 (e.g., the first signal S1) having the high level. Here, the voltage of the third node N3 (e.g., the third signal S3) having the low level may be maintained by the first capacitor C1. The sixth switching transistor M6 may turn on in response to the voltage of the third node N3 (e.g., the third signal S3) having the low level. The first voltage VGH having the high level may be provided to the scan output node NS when the sixth switching transistor M6 turns on. The first voltage VGH provided to the scan output node NS may be output as the scan signal SCAN.

The emission control signal generator 240 may output the emission control signal EM having the low level during the sixth period P6. The eleventh switching transistor M 11 may turn off in response to the voltage of the first node N1 (e.g., the first signal S1) having the high level. The ninth switching transistor M9 may turn on in response to the second voltage VGL. The voltage of the third node N3 having the low level may be provided to the fourth node N4 when the ninth switching transistor M9 turn on. The twelfth switching transistor M12 may turn on in response to the voltage of the fourth node N4 (e.g., the fourth signal S4) having the low level. The second voltage VGL having the low level may be provided to the emission output node NE when the twelfth switching transistor M12 turns on. The second voltage VGL provided to the emission output node NE may be output as the emission control signal EM.

During a seventh period P7, the first clock signal CLK1 having the high level, the second clock signal CLK2 having the low level, and the start signal FLM or the carry signal CARRY having the high level may be provided to the stage 200.

The scan signal generator 220 may output the scan signal SCAN having the high level during the seventh period P7 The voltage of the third node N3 (e.g., the third signal S3) having the low level may be maintained by the first capacitor during the seventh period P7. The second switching transistor M2 and the sixth switching transistor M6 may turn off in response to the third signal S3 having the low level. The first voltage VGH having the high level may be provided to the scan output node NS when the sixth switching transistor M6 turns on. The first voltage VGH provided to the scan output node NS may be output as the scan signal SCAN. The third switching transistor M3 may turn on in response to the second clock signal CLK2 having the low level. The first voltage VGH having the high level may be provided to the first node N1 when the second switching transistor M2 and the third switching transistor M3 turn on. The voltage of the first node N1 (e.g., the first signal S1) having the high level may be provided to the second node N2 because the eighth switching transistor M8 turns on in response to the second voltage VGL. The seventh switching transistor M7 may turn off in response to the voltage of the second node N2 (e.g., second signal S2) having the high level.

The emission control signal generator 240 may output the emission control signal EM having the low level during the seventh period P7. The eleventh switching transistor M11 may turn off in response to the voltage of the first node N1 (e.g., the first signal S1) having the high level. The ninth switching transistor M9 may turn on in response to the second voltage VGL. The voltage of the third node N3 (e.g., the third signal S3) having the low level may be provided to the fourth node N4 when the ninth switching transistor M9 turns on. The tenth switching transistor M10 and the twelfth switching transistor M12 may turn on in response to the voltage of the fourth node (e.g., the fourth signal S4) having the low level. The voltage of the fourth node N4 may be decreased by the third capacitor C3 when the tenth switching transistor M10 turns on. Thus, the twelfth switching transistor M12 be stably driven. The second voltage VGL having the low level may be provided to the emission output node NE when the twelfth switching transistor M12 turns on. The second voltage VGL provided to the emission output node NE may be output as the emission control signal EM.

During an eighth period P8, the first clock signal CLK1 having the high level, the second clock signal CLK2 having the high level, and the start signal FLM or the carry signal CARRY having the high level may be provided to the stage 200.

The scan signal generator 220 may output the scan signal SCAN having the high level during the eighth period P8. The voltage of the second node N2 (e.g., the second signal S2) having the high level may be maintained by the second capacitor C2. The seventh switching transistor M7 may turn off in response to the voltage of the second node (e.g., the second signal S2) having the high level. The eighth switching transistor M8 may turn on in response to the second voltage VGL having the low level. The voltage of the second node N2 (e.g., the second signal S2) having the high level may be provided to the first node N1 when the eighth switching transistor M8 turns on. The fourth switching transistor M4 may turn off in response to the voltage of the first node N1 (e.g., the first signal S1) having the high level. The sixth switching transistor M6 may turn on in response to the third signal S3 having the low level, which is maintained by the first capacitor C1. The first voltage VGH having the high level may be provided to the scan output node NS. The first voltage VGH provided to the scan output node NS may be output as the scan signal SCAN.

The emission control signal generator 240 may output the emission control signal EM having the low level during the eighth period P8. The eleventh switching transistor M11 may turn off in response to the voltage of the first node N1 (e.g., the first signal S1) having the high level. The ninth switching transistor M9 may turn on in response to the second voltage VGL. The voltage of the third node N3 (e.g., the third signal S3) having the low level may be provided to the fourth node N4 when the ninth switching transistor M9 turns on. The tenth switching transistor M10 may turn on in response to the voltage of the fourth node N4 (e.g., the fourth signal S4) having the low level. The voltage of the fourth node N4 may be increased to the low level by the third capacitor C3 when the tenth switching transistor M10 turns on. The twelfth switching transistor M12 may turn on in response to the voltage of the fourth node N4 (e.g., the fourth signal S4) having the low level. The second voltage VGL having the low level may be provided to the emission output node NE when the twelfth switching transistor M12 turns on. The second voltage VGL provided to the emission output node NE may be output as the emission control signal EM.

As described above, the stage 200 of the integration driver 100 may include the scan signal generator 220 that generates the scan signal SCAN and the emission control signal generator 240 that generates the emission control signal EM using signals generated in the scan signal generator 220. Thus, the dead space that occurs when the stages of a scan driver and the stages of an emission driver are separately disposed may be decreased.

Figure 4:
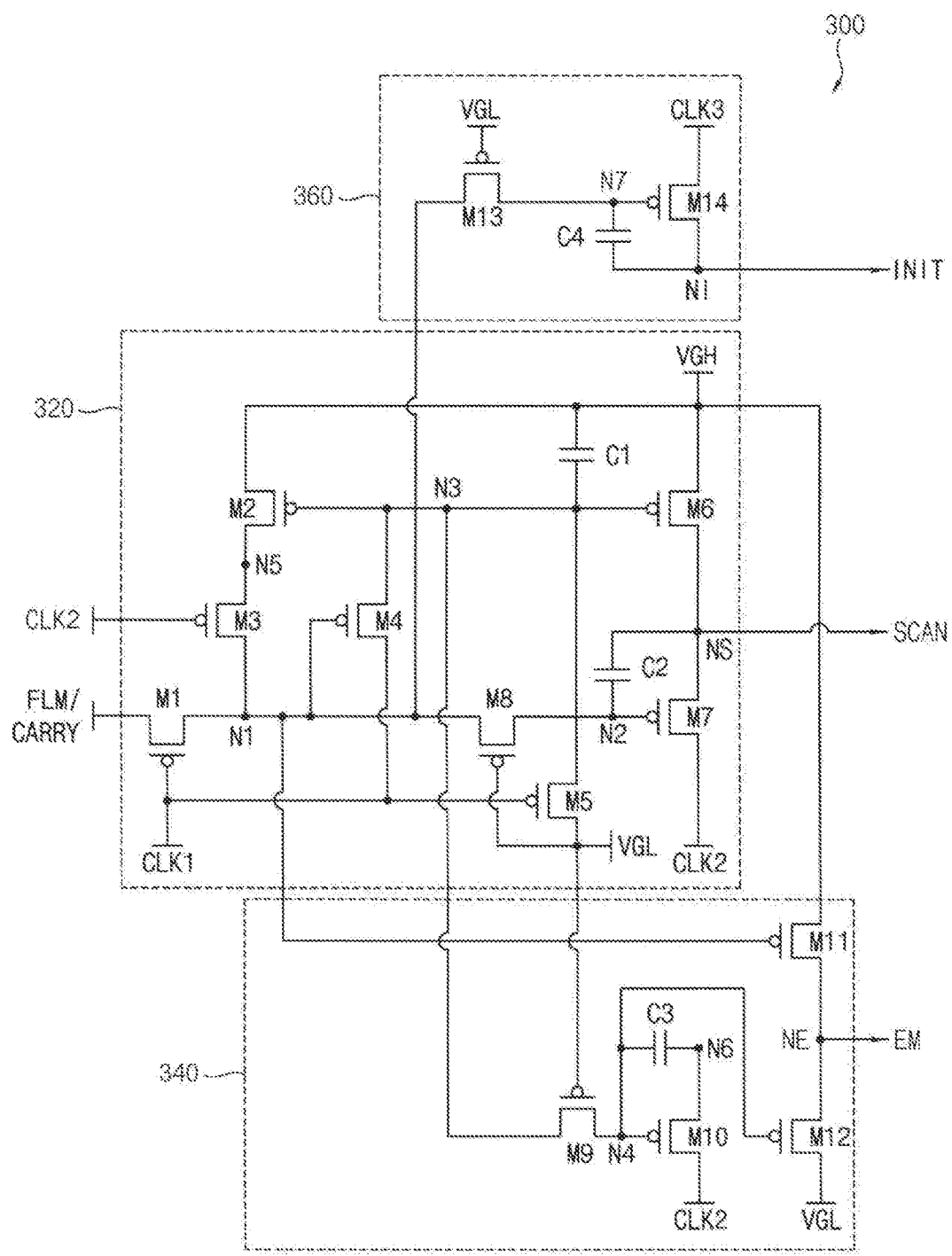
FIG. 4 is a circuit diagram illustrating a stage included in the integration driver of FIG. 1 according to an exemplary embodiment of the present inventive concept.

FIG. 4 is a circuit diagram illustrating a stage included in the integration driver of FIG. 1 according to an exemplary embodiment of the present inventive concept.

Referring to FIG. 4, a stage 300 of the integration driver 100 may include a scan signal generator 320 and an emission control signal generator 340 and further include an initialization signal generator 360. The scan signal generator 320 and the emission control signal generator 340 may be substantially the same as the scan signal generator 220 and the emission control signal generator 240, respectively, of FIG. 2.

The initialization signal generator 360 may generate a fifth signal provided to a seventh node N7 based on the first signal and may generate an initialization signal INIT based on the fifth signal and a third clock signal CLK3. Here, the initialization signal INIT may be a voltage that initializes the driving transistor and the organic light emitting diode included in the pixel. Furthermore, the fifth signal may be the voltage provided to the seventh node N7. The fifth signal may have the low level voltage or the high level voltage to control an operation of a switching transistor. The stage 300 of FIG. 4 has substantially the same structure as the stage 200 of FIG. 2, except that the initialization signal generator 360 is included.

The initialization signal generator 360 may include a thirteenth switching transistor M13, a fourteenth switching transistor M14, and a fourth capacitor C4. The thirteenth switching transistor M13 may turn on or off in response to the second voltage VGL. The thirteenth switching transistor M13 may be coupled to the first node N1 and the seventh node N7. The thirteenth switching transistor M13 may have a gate electrode coupled to the second voltage providing line, a first electrode coupled to the first node N1, and a second electrode coupled to the seventh node N7. The voltage of the first node N1 (e.g., the first signal S1) may be provided to the seventh node N7 when the thirteenth switching transistor M13 turns on.

The fourteenth switching transistor M14 may turn on or off in response to the fifth signal. The fourteenth switching transistor M14 may be coupled to a third clock signal providing line and an initialization signal output node NI. The fourteen switching transistor M14 may have a gate electrode coupled to the seventh node N7, a first electrode coupled to the third clock signal providing line, and a second electrode coupled to the initialization signal output node NI. The third clock signal CLK3 may be provided to the initialization signal output node NI when the fourteen switching transistor M14 turns on.

The fourth capacitor C4 may be coupled between the seventh node N7 and the initialization signal output node NI. The fourth capacitor C4 may include a first electrode coupled to the seventh node N7 and a second electrode coupled to the initialization output node NI.

The first through fourteenth switching transistors M1, . . . , M14 may be implemented as PMOS transistors, as illustrated in FIG. 4. In this case, the first through fourteenth switching transistors M1, . . . , M14 may turn on in response to a signal having a low level voltage (e.g., VGL). Although the first through fourteenth switching transistor M1, . . . , M14 are implemented as PMOS transistors in FIG. 4, the inventive concept is not limited thereto. For example, the first through fourteenth switching transistor M1, . . . , M14 may be implemented as NMOS transistors. In this case, the first through fourteenth switching transistors M1, . . . , M14 may turn on in response to a signal having a high level voltage (e.g., VGH).

Figure 5:
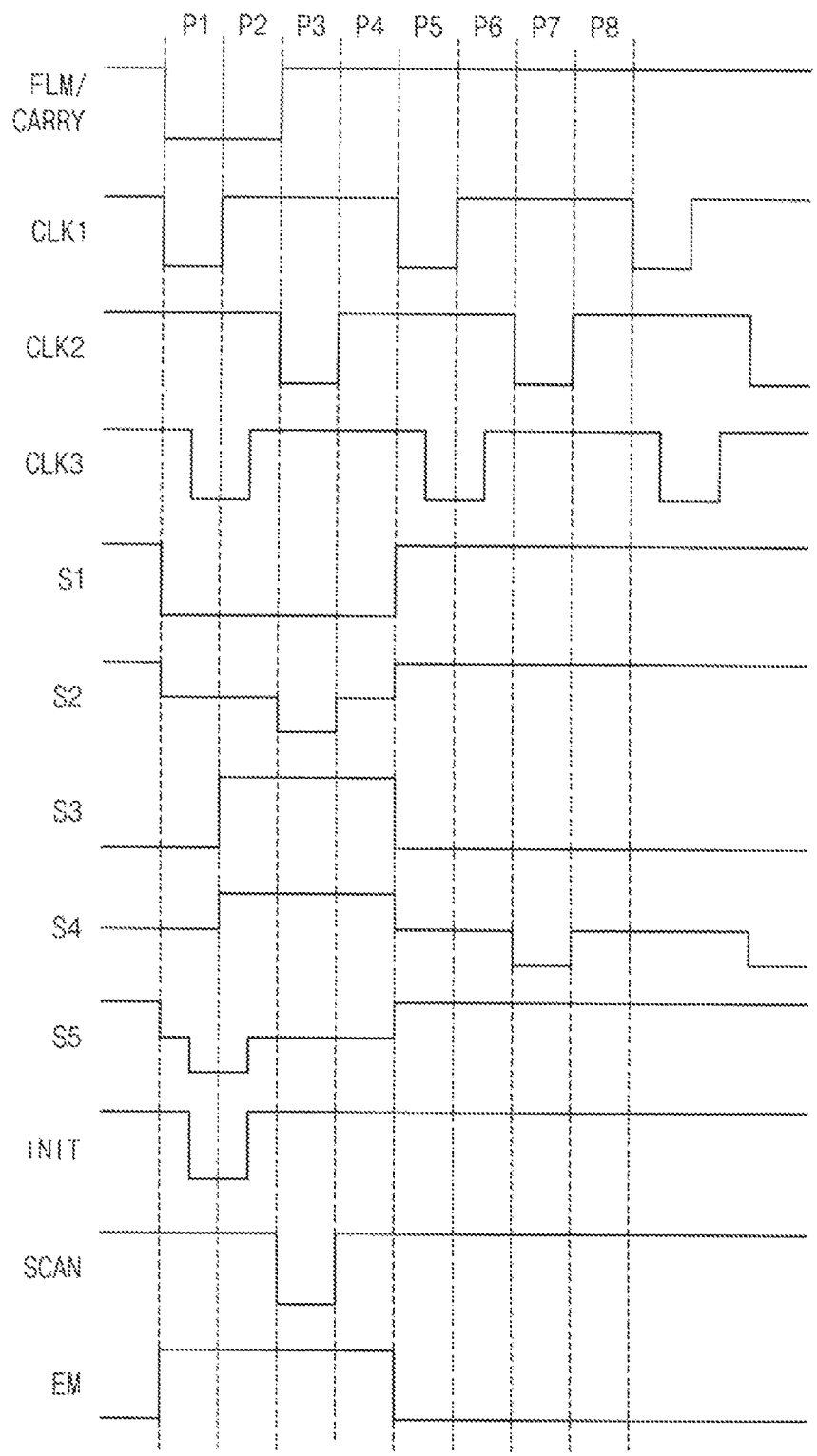
FIG. 5 is a timing diagram illustrating an operation of the stage of FIG. 4 according to an exemplary embodiment of the present inventive concept.

FIG. 5 is a timing diagram illustrating an operation of the stage of FIG. 4 according to an exemplary embodiment of the present inventive concept.

Referring to FIG. 5, the first clock signal CLK1, the second clock signal CLK2, and the third clock signal CLK3 may have substantially the same cycle. The second clock signal CLK2 and the third clock signal CLK3 may be shifted with respect to the first clock signal CLK1 by predetermined periods. Each of the first through fourteenth switching transistors M1, . . . , M14 of the stage 300 of FIG. 4 may turn on in response to a voltage having the low level and turn off in response to a voltage having the high level.

The operation of the scan signal generator and the emission control signal generator in FIG. 5 may be substantially the same as that described in FIG. 3.

The voltage of the first node N1 (e.g., the first signal N1) may be provided to the seventh node N7 because the thirteenth switching transistor M13 turns on in response to the second voltage VGL. The voltage provided at the seventh node N7 is a fifth signal S5. The fourteenth switching transistor M14 may turn on when the voltage of the first node N1 (e.g., the first signal) having the low level is provided to the seventh node N7, resulting in the fifth signal S5 having the low level. The third clock signal CLK3 may be output as the initialization signal INIT.

As described above, the stage 300 of the integration driver 100 may generate the emission control signal EM and the initialization signal INIT using the signals generated in the scan signal generator 320. Thus, the dead space that occurs when stages of an emission control driver and stages of an initialization driver are separately disposed may be decreased.

Figure 6:
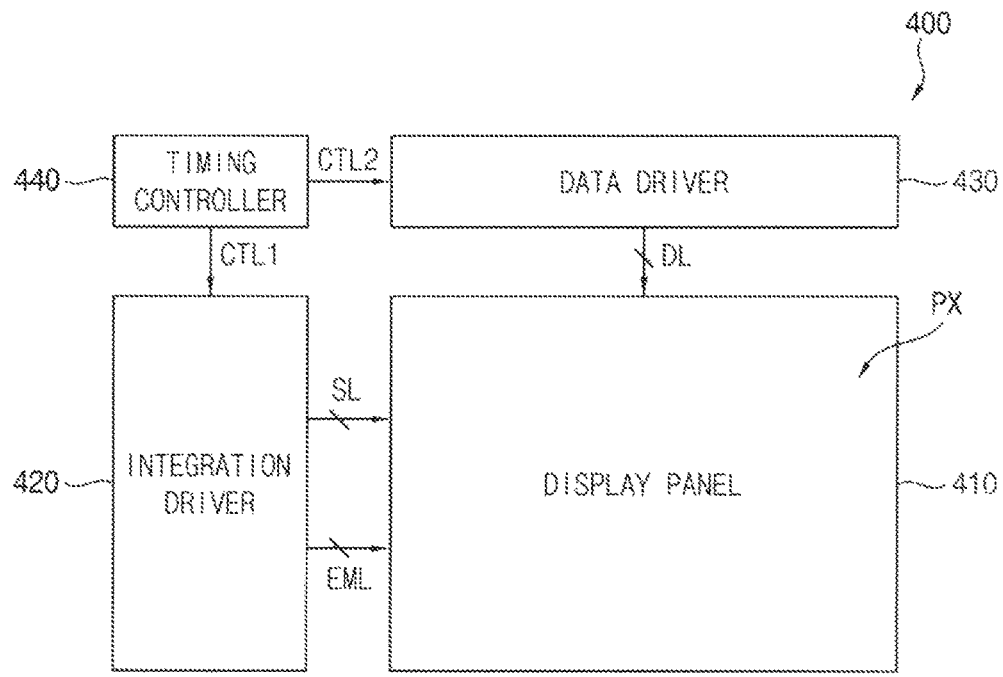
FIG. 6 is a block diagram illustrating a display device according to an exemplary embodiment of the present inventive concept.
Figure 7:
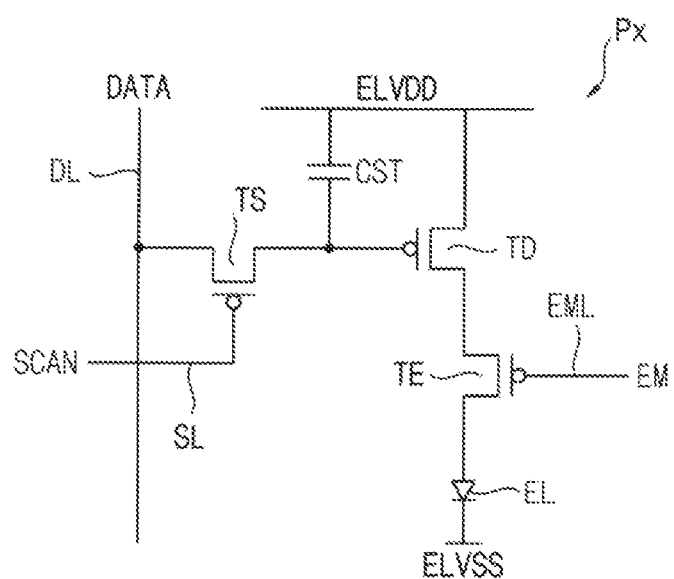
FIG. 7 is a circuit diagram illustrating a pixel included in the display device of FIG. 6 according to an exemplary embodiment of the present inventive concept.

FIG. 6 is a block diagram illustrating a display device according to an exemplary embodiment of the present inventive concept and FIG. 7 is a circuit diagram illustrating a pixel included in the display device of FIG. 6 according to an exemplary embodiment of the present inventive concept.

Referring to FIG. 6, a display device 400 may include a display panel 410, an integration driver 420, a data driver 430, and a timing controller 440.

The display panel 410 may include a plurality of pixels Px. A plurality of scan lines SL, a plurality of emission control lines EML, and a plurality of data lines DL may be disposed on the display panel 410. The plurality of pixels Px may be disposed at intersecting regions of the data lines DL and the scan lines SL.

Referring to FIG. 7, the pixel Px may include a driving transistor TD, a scan transistor TS, a storage capacitor CST, an emission transistor TE, and an organic light emitting diode EL. The scan transistor TS may turn on or off in response to the scan signal SCAN provided through the scan line SL. A data signal DATA provided to the data line DL may be stored in the storage capacitor CST when the scan transistor TS turns on in response to the scan signal SCAN. The driving transistor TD may generate a driving current based on the data signal DATA. The emission transistor TE may turn on or off in response to the emission control signal EM provided through the emission control line EML. The driving current may be provided to the organic light emitting diode EL when the emission transistor TE turns on in response to the emission control signal EM. The pixel Px may further include an initialization block that initializes the driving transistor TD or the organic light emitting diode EL in response to the initialization signal (e.g., the initialization signal INIT described with reference to FIGS. 4 and 5) provided from the integration driver 420.

The driving transistor TD, the scan transistor TS, and the emission transistor TE may be implemented as PMOS transistors as illustrated in FIG. 7. In this case, the driving transistor TD, the scan transistor TS, and the emission transistor TE may turn on in response to a signal having a low level (e.g., ELVSS). Although the driving transistor TD, the scan transistor TS, and the emission transistor TE are implemented as PMOS transistors in FIG. 7, the present inventive concept is not limited thereto. For example, the driving transistor TD, the scan transistor TS, and the emission transistor TE may be implemented as NMOS transistors. In this case, the driving transistor TD, the scan transistor TS, and the emission transistor TE may turn on in response to a signal having a high level (e.g., ELVDD).

The integration driver 420 may provide the scan signal SCAN to the pixels Px through the scan lines SL and the emission control signal EM to the pixels Px through the emission control lines EML. The integration driver 420 may include a plurality of stages. The stages may be dependently coupled. Each of the stages may provide the scan signal SCAN and the emission control signal EM. Each of the stages may include a scan signal generator (e.g., the scan signal generator 220 of FIG. 2) and an emission control signal generator (e.g., the emission control signal generator 240 of FIG. 2). Accordingly, similar to the description above, the scan signal generator may generate a first signal provided to a first node, a second signal provided to a second node, and a third signal provided to a third node based on a first clock signal, a second clock signal, and a start signal or a carry signal. The scan signal generator may generate the scan signal SCAN based on the second signal and the third signal. The scan signal generator may include first through eighth switching transistors and first and second capacitors. The scan signal generator may provide the scan signal SCAN that turns on the switching transistor TS of the pixel Px during a scan period. The emission control signal generator may generate a fourth signal provided to a fourth node based on the third signal and the second clock signal. The emission control signal generator may generate the emission control signal EM based on the first signal and the fourth signal. The emission control signal generator may include ninth through twelfth switching transistors and a third capacitor. The emission control signal generator may provide the emission control signal EM that turns on the emission transistor TE of the pixel Px during an emission period.

The integration driver 420 may further include an initialization signal generator. The initialization signal generator may generate a fifth signal provided to a seventh node based on the first signal. The initialization signal generator may generate the initialization signal based on the fifth signal and the third clock signal. The initialization signal generator may provide the initialization signal to the pixel Px during an initialization period.

The data driver 430 may provide the data signal DATA to the pixels Px through the data lines DL in response to the scan signal SCAN. The timing controller 440 may generate control signals CTL1 and CTL2 that control the integration driver 420 and the data driver 430, respectively.

As described above, the display device 400 of FIG. 6 may decrease the dead space that occurs when stages of a scan driver and stages of an emission driver are separately disposed by including the integration driver 420 that includes the plurality of stages that generates the scan signal SCAN and the emission control signal EM.

Figure 8:
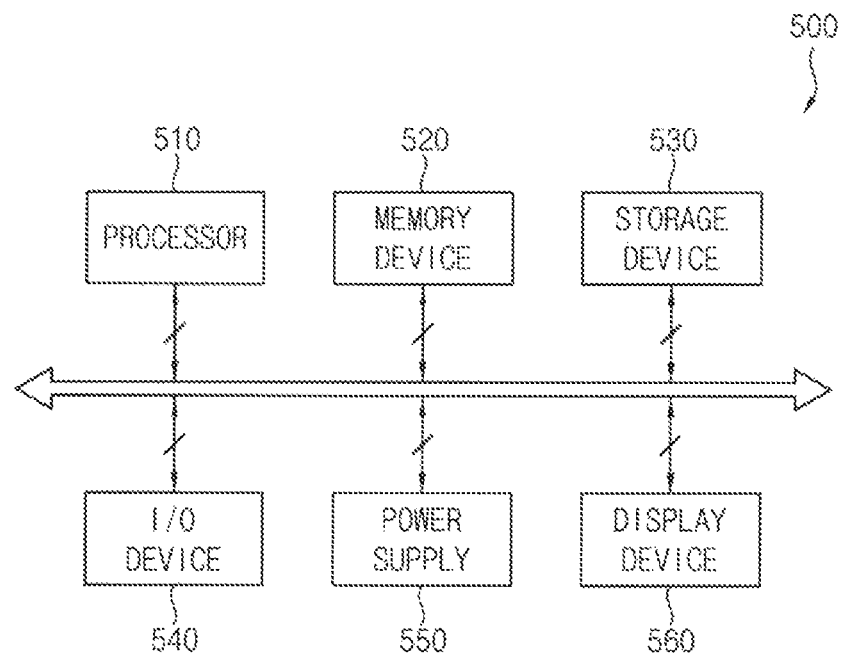
FIG. 8 is a block diagram illustrating an electronic device that includes the display device of FIG. 6 according to an exemplary embodiment of the present inventive concept.
Figure 9:
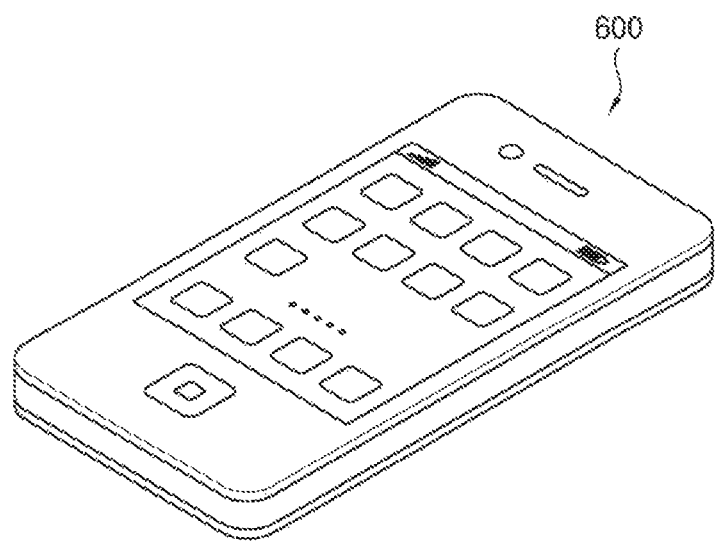
FIG. 9 is a diagram illustrating the electronic device of FIG. 8 implemented as a smart phone according to an exemplary embodiment of the present inventive concept.

FIG. 8 is a block diagram illustrating an electronic device that includes the display device of FIG. 6 according to an exemplary embodiment of the present inventive concept and FIG. 9 is a diagram illustrating the electronic device of FIG. 8 implemented as a smart phone according to an exemplary embodiment of the present inventive concept.

Referring to FIGS. 8 and 9, an electronic device 500 may include a processor 510, a memory device 520, a storage device 530, an input/output (I/O) device 540, a power device 550, and a display device 560. Here, the display device 560 may correspond to the display device 400 of FIG. 6. In addition, the electronic device 500 may further include a plurality of ports for communicating with a video card, a sound card, a memory card, a universal serial bus (USB) device, other electronic devices, etc. Although it is illustrated in FIG. 9 that the electronic device 500 is implemented as a smart phone 600, the present inventive concept is not limited thereto.

The processor 510 may perform various computing functions. The processor 510 may be a micro processor, a central processing unit (CPU), etc. The processor 510 may be coupled to other components via an address bus, a control bus, a data bus, etc. Furthermore, the processor 510 may be coupled to an extended bus such as a peripheral component interconnect (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may be a solid stage drive (SSD) device, a hard disk drive (HDD) device, a CD-ROM device, etc.

The I/O device 540 may be an input device such as a keyboard, a keypad, a touchpad, a touch-screen, a mouse, etc, and an output device such as a printer, a speaker, etc. In exemplary embodiments of the present inventive concept, the display device 560 may be included in the I/O device 540. The power device 550 may provide power for operations of the electronic device 500. The display device 560 may communicate with other components via the buses or other communication links. As described above, the display device 560 may include a display panel, an integration driver, a data driver, and a timing controller. The display panel may include a plurality of pixels. The integration driver may include a plurality of stages. Each of the stages may include a scan signal generator that generates a scan signal and an emission control signal generator that generates an emission control signal. The scan signal generator may generate a first signal provided to a first node, a second signal provided to a second node, and a third signal provided to a third node based on a first clock signal, a second clock signal, and a start signal or a carry signal. The scan signal generator may generate the scan signal based on the second signal and the third signal. The emission control signal generator may generate a fourth signal provided to a fourth node based on the third signal and the second clock signal and generate an emission control signal based on the first signal and the fourth signal. An initialization signal generator may generate a fifth signal provided to a seventh node and an initialization signal based on the fifth signal and a third clock signal. The data driver may provide a data signal to the pixels through the plurality of data lines according to the scan signal. The timing controller may generate control signals that control the integration driver and the data driver.

As described above, the electronic device 500 of FIG. 8 may include the display device 560 that includes the integration driver. The integration driver may decrease a dead space that occurs when stages of a scan driver and stages of an emission control driver are separately disposed by including a plurality of stages that generates the scan signal and the emission control signal.

In other words, a display device including an integration driver that integrates the scan stages and the emission stages may decrease dead space of a display panel therein. Therefore, a display defect such as a flicker defect may be prevented.

The present inventive concept may be applied to any display device or any electronic device having a display device. For example, the present inventive concept may be applied to a computer monitor, a laptop, a digital camera, a cellular phone, a smart phone, a smart pad, a television, a personal digital assistant (PDA), a portable multimedia player (PMP), an MP3 player, a navigation system, a game console, a video phone, etc.

While the present inventive concept has been shown and described with reference to exemplary embodiments thereof, it will be apparent to those of ordinary skill in the art that various modifications in form and details may be made thereto without materially departing from the spirit and scope of the present inventive concept as defined by the following claims.

What is claimed is:

1. An integration driver comprising a plurality of stages, wherein each of the plurality of stages comprises:
    a scan signal generator comprising first to third nodes and a fifth node, and configured to generate a first signal provided to a first node, a second signal provided to a second node, and a third signal provided to a third node using a first clock signal, a second clock signal, and a start signal or a carry signal, and generate a scan signal using the second signal and the third signal; and an emission control signal generator comprising a fourth node and a sixth node, and configured to generate a fourth signal provided to a fourth node using the third signal and the second clock signal, and generate an emission control signal using the first signal and the fourth signal, wherein the scan signal generator comprises a switching transistor configured to turn on or off in response to a second voltage provided by a second voltage providing line, and the switching transistor is coupled between the first node and the second node.

2. The integration driver of claim 1, wherein the scan signal generator further comprises:
a first switching transistor configured to turn on or off in response to the first clock signal, wherein the first switching transistor is coupled between a first node and one of a start signal providing line or a carry signal providing line;
a second switching transistor configured to turn on or off in response to the third signal, wherein the second switching transistor is coupled between a first voltage providing line and the fifth node;
a third switching transistor configured to turn on or off in response to the second clock signal, wherein the third switching transistor is coupled between the first node and the fifth node;
a fourth switching transistor configured to turn on or off in response to the first signal, wherein the fourth switching transistor is coupled between a first clock signal providing line and the third node;
a fifth switching transistor configured to turn on or off in response to the first clock signal, wherein the fifth switching transistor is coupled between the second voltage providing line and the third node;
a sixth switching transistor configured to turn on or off in response to the third signal, wherein the sixth switching transistor is coupled between the first voltage providing line and a scan output node;
a seventh switching transistor configured to turn on or off in response to the second signal, wherein the seventh switching transistor is coupled between the scan output node and a second clock signal providing line;
a first capacitor coupled between the first voltage providing line and the third node; and
a second capacitor coupled between the second node and the scan output node.

3. The integration driver of claim 2, wherein a first voltage provided by the first voltage providing line is output as the scan signal when the sixth switching transistor turns on, and
wherein the second clock signal is output as the scan signal when the seventh switching transistor turns on.

4. The integration driver of claim 1, wherein the emission control signal generator comprises:
a first switching transistor configured to turn on or off in response to the second voltage provided by the second voltage providing line, wherein the first switching transistor is coupled between the third node and the fourth node;
a second switching transistor configured to turn on or off in response to the fourth signal, wherein the second switching transistor is coupled between a second clock signal providing line and the sixth node;

a third switching transistor configured to turn on or off in response to the first signal, wherein the third switching transistor is coupled between a first voltage providing line and an emission output node;
a fourth switching transistor configured to turn on or off in response to the fourth signal, wherein the fourth switching transistor is coupled between the second voltage providing line and the emission output node; and
a capacitor coupled between the fourth node and the sixth node.

5. The integration driver of claim 4, wherein a first voltage provided by the first voltage providing line is output as the emission control signal when the third switching transistor turns on, and
wherein the second voltage is output as the emission control signal when the fourth switching transistor turns on.

6. The integration driver of claim 4, wherein a W/L ratio of the third switching transistor is greater than a W/L ratio of the fourth switching transistor.

7. The integration driver of claim 4, wherein a W/L ratio of the fourth switching transistor is less than 1.

8. The integration driver of claim 1, further comprising:
an initialization signal generator configured to generate a fifth signal provided to a seventh node using the first signal, and generate an initialization signal using the fifth signal and a third clock signal.

9. The integration driver of claim 8, wherein the initialization signal generator comprises:
a first switching transistor configured to turn on or off in response to a voltage, wherein the thirteenth switching transistor is coupled between the first node and the seventh node;
a second switching transistor configured to turn on or off in response to the fifth signal, wherein the fourteenth switching transistor is coupled between a third clock signal providing line and an initialization signal output node; and
a capacitor coupled between the seventh node and the initialization signal output node.

10. The integration driver of claim 1, wherein the carry signal is the scan signal provided from a previous stage.

11. A display device comprising:
a display panel including a plurality of pixels;
an integration driver including a plurality of stages each configured to provide a scan signal and an emission control signal to the plurality of pixels;
a data driver configured to provide a data signal to the plurality of pixels through a data line; and
a timing controller configured to generate control signals that control the integration driver and the data driver,
wherein each of the plurality of stages comprises:
a scan signal generator comprising first to third nodes and a fifth node, and configured to generate a first signal provided to a first node, a second signal provided to a second node, and a third signal provided to a third node using a first clock signal, a second clock signal, and a start signal or a carry signal, and generate the scan signal using the second signal and the third signal; and
an emission control signal generator comprising a fourth node and a sixth node, and configured to generate a fourth signal provided to a fourth node using the third signal and the second clock signal, and generate the emission control signal using the first signal and the fourth signal, and wherein the emission control signal generator comprises a switching transistor configured to turn on or off in response to a second voltage provided by a second voltage providing line, and the first switching transistor is coupled between the third node and the fourth node.

12. The display device of claim 11, wherein the scan signal generator comprises:
a first switching transistor configured to turn on or off in response to the first clock signal, wherein the first switching transistor is coupled between a first node and one of a start signal providing line or a carry signal providing line;
a second switching transistor configured to turn on or off in response to the third signal, wherein the second switching transistor is coupled between a first voltage providing line and the fifth node;
a third switching transistor configured to turn on or off in response to the second clock signal, wherein the third switching transistor is coupled between the first node and the fifth node;
a fourth switching transistor configured to turn on or off in response to the first signal, wherein the fourth switching transistor is coupled between a first clock signal providing line and the third node;
a fifth switching transistor configured to turn on or off in response to the first clock signal, wherein the fifth switching transistor is coupled between the second voltage providing line and the third node;
a sixth switching transistor configured to turn on or off in response to the third signal, wherein the sixth switching transistor is coupled between the first voltage providing line and a scan output node;
a seventh switching transistor configured to turn on or off in response to the second signal, wherein the seventh switching transistor is coupled between the scan output node and a second clock signal providing line;
an eighth switching transistor configured to turn on or off in response to the second voltage provided by the second voltage providing line, wherein the eighth switching transistor is coupled between the first node and the second node;
a first capacitor coupled between the first voltage providing line and the third node; and
a second capacitor coupled between the second node and the scan output node.

13. The display device of claim 12, wherein a first voltage provided by the first voltage providing line is output as the scan signal when the sixth switching transistor turns on, and
wherein the second clock signal is output as the scan signal when the seventh switching transistor turns on.

14. The display device of claim 11, wherein the emission control signal generator further comprises:
a second switching transistor configured to turn on or off in response to the fourth signal, wherein the second switching transistor is coupled between a second clock signal providing line and the sixth node;
a third switching transistor configured to turn on or off in response to the first signal, wherein the third switching transistor is coupled between a first voltage providing line and an emission output node;
a fourth switching transistor configured to turn on or off in response to the fourth signal, wherein the fourth switching transistor is coupled between the second voltage providing line and the emission output node; and
a capacitor coupled between the fourth node and the sixth node.

15. The display device of claim 14, wherein a first voltage provided by the first voltage providing line is output as the emission control signal when the third switching transistor turns on, and
wherein the second voltage is output as the emission control signal when the fourth switching transistor turns on.

16. The display device of claim 14, wherein a W/L ratio of the third switching transistor is greater than a W/L ratio of the fourth switching transistor.

17. The display device of claim 14, wherein a W/L ratio of the fourth switching transistor is less than 1.

18. The display device of claim 11, further comprising:
an initialization signal generator configured to generate a fifth signal provided to a seventh node using the first signal, and generate an initialization signal using the fifth signal and a third clock signal.

19. The display device of claim 18, wherein the initialization signal generator comprises:
a first switching transistor configured to turn on or off in response to a voltage, wherein the first switching transistor is coupled between the first node and the seventh node;
a second switching transistor configured to turn on or off in response to the fifth signal, wherein the fourteenth switching transistor is coupled between a third clock signal providing line and an initialization signal output node; and
a capacitor coupled between the seventh node and the initialization signal output node.

20. The display device of claim 11, wherein the carry signal is the scan signal provided from a previous stage.

21. An integration driver comprising a plurality of stages, wherein each of the plurality of stages comprises:
a scan signal generator configured to generate a scan signal; and
an emission control signal generator configured to generate an emission control signal,
wherein the scan signal generator comprises:
a first node to which a first signal is provided;
a second node to which a second signal is provided;
a third node to which a third signal is provided;
a fourth node to which a fourth signal is provided;
a fifth node to which a fifth signal is provided;
a first switching transistor having a gate electrode connected to a first clock signal providing line, a first electrode connected to a start signal providing line or a carry signal providing line, and a second electrode connected to the first node;
a second switching transistor having a gate electrode connected to the third node, a first electrode connected to a first voltage providing line, and a second electrode connected to the fifth node;
a third switching transistor having a gate electrode connected to a second clock signal providing line, a first electrode connected to the first node, and a second electrode connected to the fifth node;
a fourth switching transistor having a gate electrode connected to the first node, a first electrode connected to the third node, and a second electrode connected to the first clock signal providing line;
a fifth switching transistor having a gate electrode connected to the first clock signal providing line, a first electrode connected to the third node, and a second electrode connected to a second voltage providing line;

a sixth switching transistor having a gate electrode connected to the third node, a first electrode connected to the first voltage providing line, and a second electrode connected to a scan output node configured to output the scan signal;
a seventh switching transistor having a gate electrode connected to the second node, a first electrode connected to the scan output node, and a second electrode connected to the second clock signal providing line; and
an eighth switching transistor having a gate electrode connected to the second voltage providing line, a first electrode connected the first node, and a second electrode connected to the second node,
wherein the emission control signal generator is connected to the first node and the third node of the scan signal generator and is configured to generate the emission control signal using the first signal and the third signal.

* * * * *